United States Patent
Price et al.

(10) Patent No.: US 8,847,596 B2
(45) Date of Patent: Sep. 30, 2014

(54) CAPILLARY CARTRIDGE FOR MINIATURIZED NUCLEAR MAGNETIC RESONANCE (NMR) DEVICES

(75) Inventors: John C. Price, Longmont, CO (US); Michael Steinbach, Boulder, CO (US); Chris Jonkman, Broomfield, CO (US)

(73) Assignee: picoSpin, LLC, Boulder, CO (US)

(*) Notice: Subject to any disclaimer, the term of this patent is extended or adjusted under 35 U.S.C. 154(b) by 463 days.

(21) Appl. No.: 13/171,222

(22) Filed: Jun. 28, 2011

(65) Prior Publication Data

US 2012/0001636 A1 Jan. 5, 2012

Related U.S. Application Data

(60) Provisional application No. 61/359,661, filed on Jun. 29, 2010, provisional application No. 61/359,732, filed on Jun. 29, 2010.

(51) Int. Cl.
*G01V 3/00* (2006.01)
*G01R 33/3875* (2006.01)
*G01R 33/30* (2006.01)

(52) U.S. Cl.
CPC .......... *G01R 33/302* (2013.01); *G01R 33/3875* (2013.01)
USPC .......................................... 324/318; 324/322

(58) Field of Classification Search
USPC .......................... 324/318, 322, 319, 320, 321
See application file for complete search history.

(56) References Cited

U.S. PATENT DOCUMENTS

| | | | |
|---|---|---|---|
| 3,597,633 A | 8/1971 | Hirano | |
| 3,735,306 A | 5/1973 | Kabler et al. | |
| 4,761,614 A | 8/1988 | Prammer et al. | |
| 4,782,295 A | 11/1988 | Lew | |
| 4,785,245 A | 11/1988 | Lew et al. | |
| 5,004,974 A | 4/1991 | Cattaneo et al. | |
| 5,654,636 A | 8/1997 | Sweedler et al. | |
| 5,684,401 A | 11/1997 | Peck et al. | |
| 5,773,976 A | 6/1998 | Sakakura et al. | |
| 5,858,154 A | 1/1999 | Toki | |
| 6,097,188 A | 8/2000 | Sweedler et al. | |
| 6,194,900 B1* | 2/2001 | Freeman et al. | 324/321 |
| 6,456,072 B1 | 9/2002 | Webb et al. | |
| 6,788,061 B1 | 9/2004 | Sweedler et al. | |
| 6,822,454 B2 | 11/2004 | Peck et al. | |
| 7,141,978 B2 | 11/2006 | Peck et al. | |
| 7,345,479 B2* | 3/2008 | Park et al. | 324/300 |
| 7,612,563 B2* | 11/2009 | Massin et al. | 324/321 |

(Continued)

OTHER PUBLICATIONS

Y. Maguire et al., Toward a table-top quantum computer, IBM Systems Journal, vol. 39 Nos. 3&4, 2000, pp. 823-939.

(Continued)

*Primary Examiner* — Louis Arana
(74) *Attorney, Agent, or Firm* — Gordon Stewart

(57) ABSTRACT

A shim coil assembly for positioning shim coils in a narrow gap between magnetic poles of miniature NMR devices around the magnetic center includes electric traces on multiple levels of printed circuit board layers in various, overlapping configurations. Mirror image shim coils can be connected in series in a symmetric sense or connected in series in a antisymmetric sense.

17 Claims, 3 Drawing Sheets

(56) References Cited

U.S. PATENT DOCUMENTS

| | | | |
|---|---|---|---|
| 8,471,559 B2* | 6/2013 | Taherian et al. | 324/303 |
| 2002/0140425 A1 | 10/2002 | Prammer et al. | |
| 2002/0149369 A1 | 10/2002 | Peck et al. | |
| 2003/0020476 A1 | 1/2003 | Duensing | |
| 2005/0030033 A1 | 2/2005 | Peck et al. | |
| 2005/0253587 A1 | 11/2005 | Peck et al. | |
| 2006/0213283 A1 | 9/2006 | Morris et al. | |
| 2007/0132452 A1 | 6/2007 | Alsop | |
| 2007/0164737 A1 | 7/2007 | Pusiol | |
| 2008/0136416 A1 | 6/2008 | Goetz et al. | |
| 2008/0186024 A1 | 8/2008 | Edwards | |
| 2011/0137589 A1 | 6/2011 | Leskowitz et al. | |

OTHER PUBLICATIONS

Andrew G. Webb, Radiofrequency Microcoils in Magnetic Resonance, Jan. 27, 1997, Department of Electrical and Computer Engineering, University of Urbana-Champaign.

Odeblad, Coils for Microgram Samples and the Associated Circuitry, 1966, Acta Obstet Gynecol Scand, vol. 45, chptr 9, pp. 84-98 (downloaded from informahealthcare.com by University of Colorado Libraries on Aug. 10, 2010).

Alison Nordon, Colin A. McGill and David Littlejohn, Process NMR Spectrometry, Jan. 25, 2001, Department of Pure and Applied Chemistry, Glasgow, UK.

* cited by examiner

CAPILLARY CARTRIDGE FOR MINIATURIZED NUCLEAR MAGNETIC RESONANCE (NMR) DEVICES

CROSS REFERENCE TO RELATED APPLICATIONS

The present application is based upon and claims the benefit of U.S. Provisional Patent application No. 61/359,661, titled "Capillary Cartridge For Miniaturized Nuclear Magnetic Resonance Devices (NMR)," filed Jun. 29, 2010, by John C. Price and U.S. Provisional Patent application No. 61/359,732, titled "Shim Coils and Shimming Miniaturized Nuclear Magnetic Resonance Magnets," filed Jun. 29, 2010 by John C. Price. The entire contents of both of the above-mentioned applications are hereby specifically incorporated herein by reference for all they disclose and teach.

BACKGROUND OF THE INVENTION

Nuclear magnetic resonance (NMR) techniques are widely used for analyzing properties of fluids and solids. NMR instruments may be placed into three classes: 1) magnetic resonance imaging (MRI) devices, which emphasize high spatial resolution; 2) NMR spectrometers, which have little or no spatial resolution but are able to resolve nuclear resonances that are closely-spaced in frequency; 3) time-domain NMR devices with neither spatial nor frequency resolution. In general, but recognizing there are many exceptions, MRI devices are used primarily in medicine and biological research to image live organisms, NMR spectrometers are used by chemists and biochemists to analyze structures of molecules, and time-domain NMR instruments are used to analyze materials properties at a coarser level than the molecular scale.

Nearly all modern NMR spectrometers are large (greater than 1 m$^3$) and use superconducting magnets cooled to cryogenic temperatures. The magnet systems and associated NMR probes and electronics are expensive (roughly $300 K to $10 M) and they require substantial facilities and maintenance support. There are also some less-powerful NMR spectrometers that use ambient-temperature permanent magnets. These machines are similar in size to the smallest of the superconducting magnet systems, but are somewhat less expensive to purchase and maintain.

The power of NMR spectroscopy for chemical analysis derives from its ability to resolve small "chemical shifts" of the nuclear magnetic resonances due to differing chemical environments. For example, the magnetic resonance frequency of hydrogen nuclei (protons) in a $CH_3$ chemical group within a liquid alkane differs from the resonance frequency of the protons in a $CH_2$ group by about 0.5 parts-per-million (ppm). Nearly all chemical shifts of protons in organic molecules are in the range 0 to 12 ppm. Chemical shift ranges are larger for some nuclear species and smaller for others. Because of the widespread application of proton NMR and the central role of hydrogen in organic chemistry, an NMR device is not usually considered to be a spectrometer unless it can resolve most proton chemical shifts. For our purposes, we define an NMR spectrometer to be an instrument with resolution better than 1.0 ppm for protons. Thus, time-domain NMR devices have spectral resolution poorer than 1.0 ppm and do not have spatial resolution.

In typical NMR spectrometers, a sample is placed in a region of uniform magnetic field. A wire coil and electronic circuits are provided to both apply radio-frequency (RF) pulses to the sample (transmit) and to detect RF signals from the sample (receive). In a typical experiment or measurement, the protons (or other nuclei under study) in the sample are first allowed to polarize in the magnetic field. Establishing equilibrium polarization takes a time which is known as $T_1$ in the NMR art. This time ranges from a fraction of a second up to 20 seconds, depending on the composition of the liquid sample. Next, one or more RF pulses are applied to the sample with frequencies at or near the resonance frequency at which the protons freely precess in the applied uniform magnetic field. The transmit pulses have the effect of tilting the proton polarization relative to the direction of the applied field. After the transmit pulse is ended the protons precess and create a time-varying magnetic field in the coil. The time-varying field induces a signal voltage in the coil which may be amplified and recorded. Either immediately, or after a delay time, the receive signal is recorded and transferred to a computer for processing.

A particular sequence of transmit pulses, delay times and data acquisition periods, together with all of the parameters needed to precisely define the sequence (times, frequencies, phases, acquisition rates) is know in the NMR art collectively as a pulse sequence. The design of NMR pulse sequences to extract desired information from a sample is a well-developed area of knowledge. A great variety of pulse sequences are known in the art, ranging from simple ones with a single transmit pulse and a single data acquisition time to much more complex sequences with many transmit pulses, time delays, transmitter phase and amplitude adjustments, and data acquisition periods. The goals of these sequences vary widely, including enhancement of spectroscopic resolution, enhancement of signal-to-noise ratio, detection of spin-spin coupling between different groups of protons (or other nuclei), suppression of strong solvent signals, suppression of coupling between like or unlike nuclei, transfer of polarization from one group of nuclei to another, measurement of relaxation rates, measurement of diffusion within the fluid and measurement of fluid flow.

Permanent magnets can be, and often are, used to create the uniform magnetic field. Such permanent magnets typically used for this purpose are made from hard magnetic material with high remnant magnetization, such as neodymium iron boron or samarium cobalt. Permanent magnets of this type have large temperature coefficients of magnetization, typically in the range 300 to 2000 ppm/° C. Because the magnetic resonance frequencies are proportional to the applied magnetic field, this implies that permanent magnet NMR spectrometers have temperature coefficients of the resonance frequencies also in the range 300 to 2000 ppm/° C. To achieve spectral resolution below 1 ppm, this temperature coefficient has to be negated, stabilized, or compensated for in some way. Methods known in the art, as applied to larger NMR spectrometers, include use of a temperature compensating magnetic material within the magnet, temperature control of the magnet, and the field-frequency lock method.

The best magnetic uniformity of most typical permanent magnet assemblies used for NMR devices is at the geometrical center of the magnet assembly, so the main channel RF coil is typically placed at the geometrical center of the magnet assembly for best NMR signal resolution. Some magnetic field shimming can be used to increase uniformity of the magnetic field produced by the magnet assembly, if necessary or desired.

The foregoing examples of related art and limitations related therewith are intended to be illustrative and not exclusive. Other limitations of the related art will become apparent to those skilled in the art upon a reading of the specification ad a study of the drawings.

BRIEF DESCRIPTION OF THE DRAWINGS

The accompanying drawings, which are incorporated herein and form a part of the specification, illustrate some, but not the only or exclusive, example embodiments and/or features. It is intended that the embodiments and figures disclosed herein are to be considered illustrative rather than limiting.

In the drawings.

DESCRIPTION OF EXAMPLE IMPLEMENTATIONS

Figure 1:
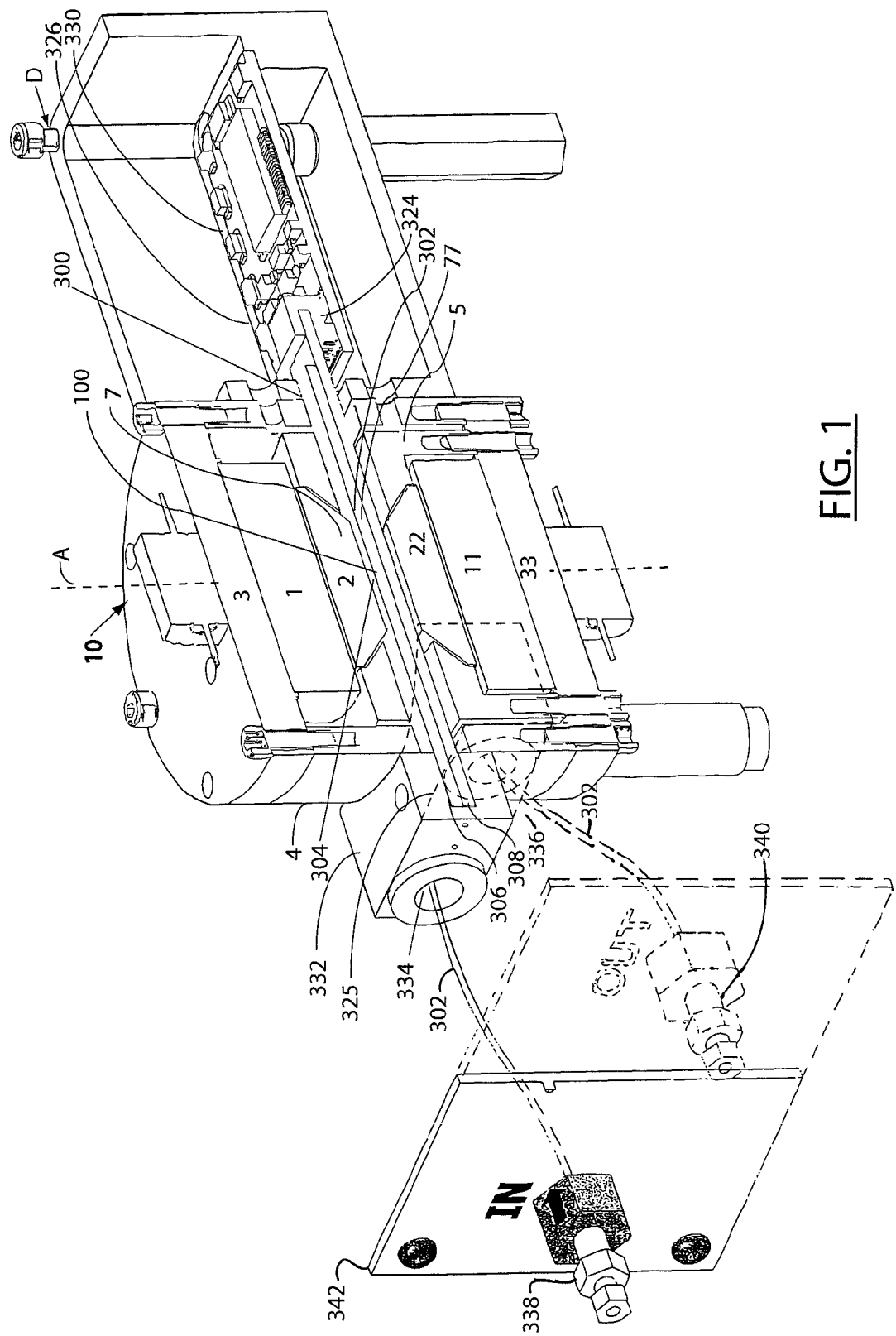
FIG. 1 is a perspective view in cross-section of an example NMR device (e.g., an NMR spectrometer) equipped with an example capillary cartridge assembly for positioning or presenting a sample into the NMR magnetic field of the device.

The resonance frequencies of atomic nuclei in an NMR device, e.g., an NMR spectrometer, are directly proportional to the magnitude of the applied magnetic field. Consequently, the root-mean-square (RMS) line-width of an NMR resonance will be greater than or equal to the RMS variation of the applied field over the volume of the sample. Field homogeneity is therefore of paramount importance in the design of NMR spectrometers. RMS field variations over a sample of fixed size will generally decrease as the size of the magnet is increased. For this reason NMR magnet assemblies are generally much larger than the NMR samples on which they are used to measure, characterize, or analyze. For example, NMR spectrometers are known in the art with sample diameters of a few millimeters placed within magnet assemblies with dimensions of a meter or more. For a miniature NMR spectrometer, it is necessary instead to use a compact magnet and to reduce the sample size until the resolution requirements can be met. The sample cannot be made arbitrarily small because the NMR signal-to-noise (SNR) ratio decreases as the sample size decreases. For field strengths accessible with permanent magnets (approximately 1-2 Tesla, or proton resonance frequencies of 40 to 90 MHz), SNR becomes intolerable for all NMR spectroscopy applications for sample diameters less than 0.1 mm and is adequate for many applications for sample diameters of about 0.3 mm or larger. Therefore it can be expected that a miniature NMR spectrometer sample will typically be contained in a fluid channel or capillary with inside diameter of about 0.1 to 1 mm, e.g., about 0.3 mm. Fluid channels or tubes in this size range are generally referred to as capillaries. The disclosed invention can be scaled up or down in proportion for capillary diameters other than 0.3 mm.

Larger NMR spectrometers known in the art most often use replaceable sample tubes of 2 to 10 mm diameter rather than a capillary to contain the liquid sample. These sample tubes are vertically oriented and closed at the bottom end so that the fluid is retained in the tube by gravity. They are easily removed and are normally changed whenever the sample is changed. Some large NMR spectrometers intended for continuous flow applications and/or intended for use with very small sample volumes use permanently installed capillaries of 1 mm diameter or less to contain the sample rather than larger sample tubes. In these cases it is possible that an NMR spectrometer or probe could become disabled if the capillary were to become blocked or contaminated. In a research laboratory environment, where large NMR spectrometers are most often used, sample fluids can be controlled so that these problems are minimized.

However, a good, robust miniature NMR spectrometer may have many applications outside the research laboratory, including clinical applications, industrial process control, and field monitoring of substances for regulatory compliance. In such applications may be beneficial to have the sample delivered into the spectrometer by flow, rather than by inserting a replaceable sample tube. Also in these applications the user may have less control over sample fluids, so that difficulties presented by capillary blockage and contamination may be more severe. Contamination problems are particularly severe in medical applications. Therefore, as better miniature NMR spectrometers are developed to become feasible for more applications, especially such applications outside the research laboratory, as described above, it is more important to develop better NMR equipment that can be operated and maintained easily with minimal time involvement and even with minimal skills or experience.

Figure 2:
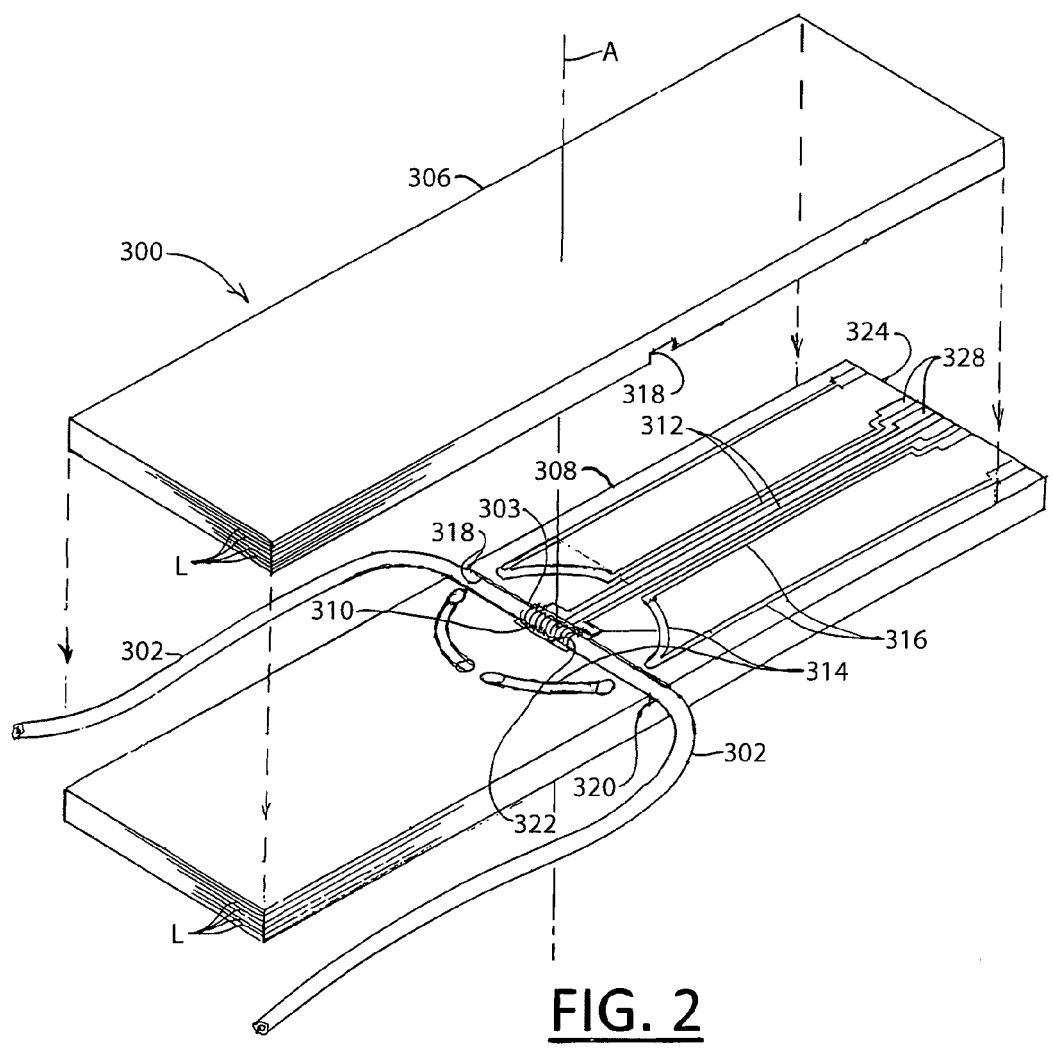
FIG. 2 is an isometric diagrammatic view of the example sample cartridge shown with the adjacent panel or circuit board components separated from each other to reveal the example sample capillary, RF coil around the capillary, and adjacent shim coil and connective electrical traces.

An example NMR capillary cartridge 300 is illustrated diagrammatically in FIGS. 1 and 2, which addresses these problems and enables field replacement of capillary fluid channels in miniature NMR devices, such as miniature NMR spectrometers, in case the capillary becomes blocked or contaminated. The example NMR capillary cartridge 300 is shown in FIG. 1 inserted into an example compact NMR magnet assembly 10 of an example miniature NMR device D, e.g., a miniature NMR spectrometer. The NMR magnet assembly 10 shown in FIG. 1 is for example only, and could be any number of configurations or sizes. However, in a miniature NMR device 10, especially a miniature NMR spectrometer in which very good frequency resolution is required for most applications, as explained above, the gap between the pole faces 7, 77 of the magnet assembly 10 would be very narrow, e.g., a few millimeters. For example only, the compact magnet assembly 10 illustrated in FIG. 1 comprises two cylindrical permanent magnets 1, 11 to provide the polarizing magnetic field, two pole pieces 2, 22 to improve homogeneity of the magnetic field, and a flux return comprising two disc-shaped covers 3, 33, and the cylindrical part 4 provide further uniformity in the magnetic field between the two juxtaposed pole faces 7, 77. The pole support 5 maintains the pole pieces in proper position with the pole faces 7, 77 preferably parallel to each other. These magnet assembly 10 components are shown in cross-sectioned views in FIG. 1, as is the rest of the device D, so only one half of each component can be seen in FIG. 1, but they are figures of revolution about the longitudinal axis A of cylindrical symmetry in a manner that can be understood easily by persons skilled in the art. Those components assembled as shown in FIG. 1 and described below provide high magnetic field homogeneity at the geometric center 100 of the magnet assembly 10.

In FIG. 1, the capillary cartridge assembly 300 is also shown in cross-section on a plane perpendicular to the cylindrical axis A of the magnet assembly 10 and passing through the magnet center 100, which is also the location of the NMR sample as contained in the capillary 302, which is shown captured or positioned in a channel 304 in the capillary cartridge 300. The RF coil 310 (FIG. 2) is also positioned around the capillary 302 at the magnetic center 100. The example capillary cartridge 300 shown in FIGS. 1 and 2 comprise an upper cartridge panel or board 306 and a lower cartridge board 308 with the capillary 302 placed along the plane where the boards 306, 308 are joined. In a preferred implementation, both boards 306, 308 comprise multi-layer printed circuit boards (MPCB) as illustrated in FIG. 2 so that wiring 312 for the NMR RF coil 310, magnetic field shim coils 314, and wiring 316 for the magnetic field shim coils 314 can be included as copper traces in layers L within the MPCBs 306, 308. The shim coils 314 and wiring 312, 316 in FIG. 2 are diagrammatic representations only to illustrate the concepts. In actuality, there would be a plurality of different shaped shim coil traces and electrical connector traces distributed on and among the multiple circuit board layers L of the multi-layer printed circuit boards L of each board 306, 308. Persons skilled in the art will understand these concepts and how to implement them, once they gain an understanding of this invention. In one implementation, both boards 306, 308 can be grooved or routed along the joining plane, as illustrated, for example, by grooves 318, 320 in FIG. 2 to provide the channel 304 (FIG. 1) to accommodate the capillary 302 in the capillary cartridge assembly 300. Such grooving or routing can also be provided to provide a cavity 322 for the NMR RF coil 310 and for joints between the NMR RF coil 312 and board traces 312.

Again, the configurations of the boards 306, 308 are for example only. Alternatively, the grooves and channel, thus the capillary 302, could be oriented to run longitudinally along the boards 306, 308 instead of transversely, or they could run both longitudinally from an outer portion and then transversely through the center or any other convenient directions or desired locations or routings. Also, alternately, one or more NMR RF coils may be formed by board traces in the layers L instead of the coiled wire coil 310 around the capillary 302. Also alternately, the shim coils may be omitted from the MPCBs 306, 308 and instead mounted within the magnet assembly 10 and apart from the capillary cartridge assembly 300. Also, alternately, coils for applying pulsed gradient magnetic field to the sample may be included in the cartridge MPCBs. These and other alternatives may be used within the scope of this invention The capillary cartridge 300 is made to be easily installed in, and removed from, the NMR device D, so that the capillary 302 can be removed for changing or servicing easily and with minimal training or skills. In the example in FIG. 1, the right end 324 of the capillary cartridge assembly 300 is inserted into a card edge connector 326, which is positioned to fix the location of the capillary cartridge assembly 300 so that the sample volume and RF coil 310 are located at the center 100 of the magnet assembly 10 when installed, and the card edge connector 326 provides electric circuit connections between the connector terminals 328 (FIG. 2) of the traces 312, 316 on the board 308 and electronic circuits 330 (FIG. 1) in the NMR device D. The left end 325 of the capillary cartridge assembly 300 is attached to the magnet assembly 10 by a cartridge mounting flange 332, which can be an integral and permanent part of the capillary cartridge assembly 300 or a separable part, if desired. The cartridge mounting flange 332 can be attached to the magnet using screws, clamps, or any other convenient detachable fastener system so that the capillary cartridge assembly 300 can be removed from the magnet assembly 10 by loosening the screws or unfastening whatever other detachable fastener system is used. If screws are used, it is preferable, but not essential, that the screws are captured by the mounted flange 332 so that they cannot be dropped inside the device enclosure. With this construction, after the screws or other fasteners on the cartridge flange 332 are loosened or unfastened, the capillary cartridge assembly 300 can be pulled out of the magnet assembly 10 (to the left in the FIG. 1 view) and removed from the NMR device D.

In the FIG. 1 example, the capillary 302 exits the boards 306, 308 through ports 334, 336 in the cartridge flange 332 (half of which is shown in phantom lines) is attached at its opposite ends to inlet and outlet bulkhead fluid connectors 338, 340 on a sub-panel 342 to the front panel (not shown) of the miniature NMR device D. In a preferred implementation, there is no mechanical connection or linkage between the capillary cartridge assembly 300 and the housing of the device D other than between the capillary 302 and the connectors 338, 340 of the subpanel 342. This arrangement provides good thermal isolation of the magnet assembly 10 from the front panel of the device D, which is important in a miniature NMR spectrometer or other device employing permanent magnets. Alternately, there may be a mechanical linkage of low thermal conductivity between the sub-panel 342 and the cartridge flange 332. Also alternately, the fluid and bulkhead connectors 338, 340 may be located on a panel other than the front panel of the device D.

Alternately, the capillary cartridge assembly 300 may accommodate two or more independent NMR channels. In this case there would be one or more additional capillaries and NMR RF coils within the cartridge assembly. If the fluid within an additional channel is replaceable by the user, there will also be additional capillary connections to the sub-panel. On the other hand, if an additional channel is intended as a lock channel to implement field-frequency lock stabilization, then the lock channel fluid may be permanently installed in the cartridge assembly, and no additional fluid connections to the front panel are needed. In this case, the user may still change the lock channel by replacing the entire cartridge assembly with one that contains a different lock fluid.

Other alternatives include forming the channel in only one of several boards in the board assembly, or making the mating grooves in juxtaposed boards to be of different depths, or any other convenient manner of providing one or more channels in a board assembly to capture and place the sample capillary at the magnet center 100 when the capillary cartridge 300 is placed in a mounted position on or in relation to the magnet assembly.

Figure 3:
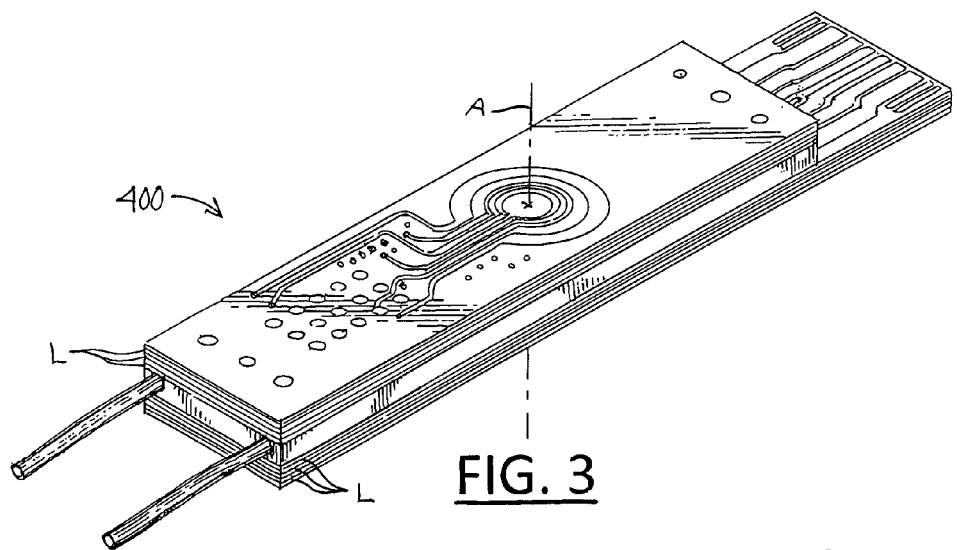
FIG. 3 is an isometric diagrammatic view of another example implementation of the capillary cartridge.
Figure 4:
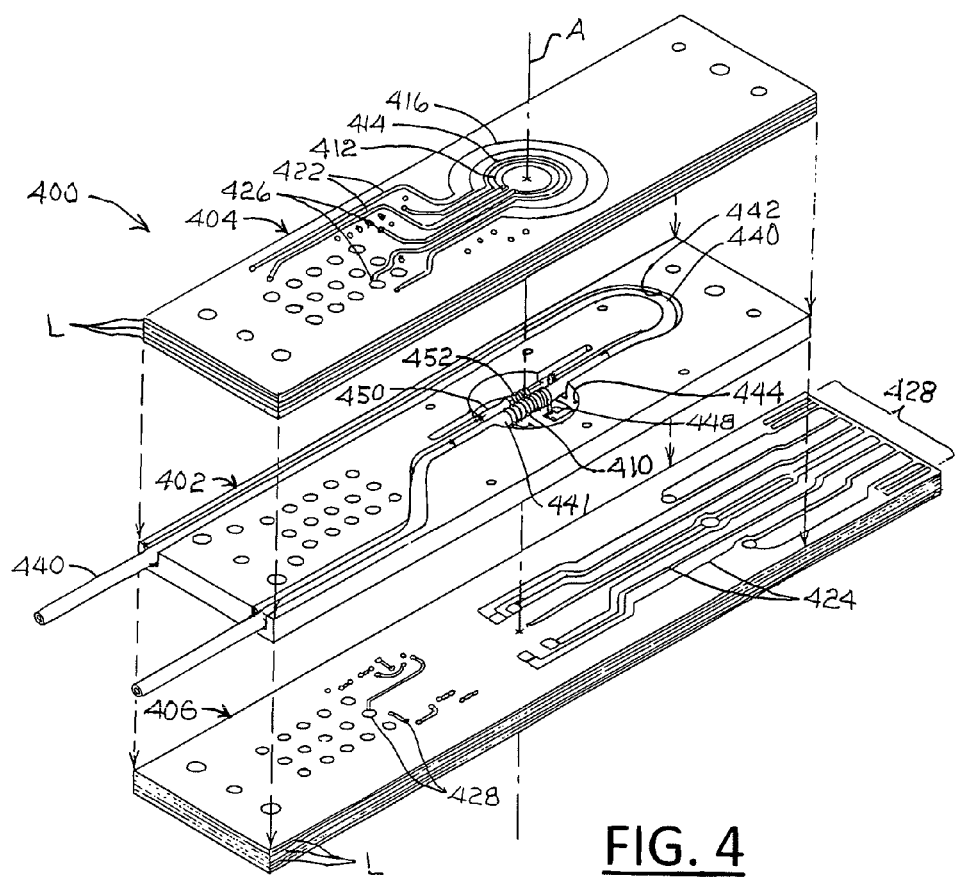
FIG. 4 is an isometric, exploded view to show details of the capillary panel.

In one alternate example implementation of a capillary cartridge 400 is shown in FIGS. 3 and 4, a separate capillary panel 402 is shown sandwiched between two circuit boards 404, 406. The printed circuit boards 404, 406 can be multi-layer printed circuit boards that not only make the necessary electrical connections to the coil 410, but also include electric traces shaped to form various shim coils, three of which coils 412, 414, 416 are illustrated on the top of the circuit board 404, but others of which are printed onto the several layers L in various shapes and sizes as needed for a particular magnetic field shimming application and embedded in the multi-layer circuit boards 404, 406, thus not visible in FIGS. 3 and 4. The multilayer circuit boards 404, 406 also include various electrical traces 422, 424 and through-layer connectors 426, 428 for electrically connecting the RF coil 410 and the various shim coils in the layers L to electrical circuits, for example, via the edge connector terminals 428.

The capillary panel 402 includes a sample capillary 440 positioned in a channel 442 that is shaped to position a portion of the capillary 440 at the center 100 (FIG. 1) of the NMR magnet assembly when the capillary cartridge 400 is installed in the NMR device 10. In the example implementation 400, the capillary panel 402 has an aperture 444 through which the capillary 440 is positioned to accommodate a RF coil 410 for transmitting and receiving NMR excitations to and from a sample in the capillary 440. An optional reference capillary

450 with its own separate RF coil 452 is also shown in the example capillary panel 402 adjacent to the capillary 440 and RF coil 410 to provide an external reference for such uses as mitigating or compensating for the effects of variations in the magnetic field over time, for example, because of temperature changes, aging of the NMR magnets, and the like. Use of external references for such purposes are known by persons skilled in the art, thus not a part of this invention.

The capillaries 302, 440 may be made from any electrically insulating and non-magnetic material, for example, but not for limitation, polyimide, polyether ether ketone (PEEK), polytetrafluoroethylene (PTFE), or glass. A glass capillary may be coated with polyimide to increase its ruggedness. A thin-walled capillary 302, 440, especially in the region of the RF coil 310, 410, is beneficial in order to maximize the NMR signal strength from the sample in the capillary. For some applications the capillary must also be able to withstand high pressures. The capillary material should also be chemically compatible with the sample and reference fluids. The portion of the capillary 302, 440 that extends outwardly from the cartridge 300, 400 to extend between the cartridge 300, 400 and the fluid sub-panel 342 (FIG. 1) should be flexible and rugged to accommodate installation of the cartridge 300, 400 into the NMR device 10 without breakage. To best meet all of these requirements, the choice of materials may differ for different applications and even for different sections of the capillary 302, 440. Quartz glass has many of these attributes for the portion 303, 441 of the main sample capillary 302, 440 as well as for the reference capillary 450 at the locations of the RF coils 410, 452, whereas PTFE may be beneficial for the portions 305, 443 of the main capillary 302, 440 that are extend through the rest of the capillary panel 300 and to the fluid sub-panel 342.

The central aperture or hole 444 shown in FIG. 4 in the capillary panel 402 is provided to create space for the sample capillary 440 and the RF coil 410 and for the wire leads 448 to the coils 410. If the optional reference capillary 450 and coil 452 is used, the aperture or hole 444 also accommodates those components and electrical leads. It has been found that a circular shape for the aperture or hole 444, centered on the main coil 410, as opposed to rectangular or other shapes, minimizes distortion of the NMR magnetic field due to the magnetic susceptiblity of the capillary panel material, which is small but not negligible. The magnetic susceptibility of wires of the coil 410 also distort the magnetic field, because they are made of a metal with high electrical conductivity and low magnetic susceptiblity, e.g., copper. Such distortion can be reduced by filling or 'potting' the empty space within the central aperture or hole 444 with a material whose magnetic susceptibility matches or nearly matches that of the coil wire material. Suitable materials for this purpose may include epoxies and acrylics, which may be selected or formulated to have the desired magnetic susceptiblity.

The optional reference capillary can be filled with a known fluid, for example, water or acetone, which generates a strong singlet NMR line, and it can be permanently sealed. The use of a separate reference sample within the same magnet system is a known technique in the NMR field, sometimes called an 'external reference'. By comparing signals from the main sample capillary 440 with those from the reference capillary 450, the effects of variations over time of the magnetic field can be mitigated. The magnetic field may vary because of changes of the temperature of the magnet or because of magnet aging effects. The use of an 'internal reference' for the same purpose is also an established technique in NMR. In this case a known reference fluid is mixed with the sample fluid in the main sample capillary, or the reference signal is obtained from a known feature in the spectrum of the sample in the main capillary. Either or both methods of referencing may be used with the capillary cartridge 300, 400.

The foregoing description provides examples that illustrate the principles of the invention, which is defined by the claims that follow. Since numerous insignificant modifications and changes will readily occur to those skilled in the art once they understand the invention, it is not desired to limit the invention to the exact example constructions and processes shown and described above. The words "comprise," "comprises," "comprising," "include," "including," and "includes" when used in this provisional application are intended to specify the presence of stated features, integers, components, or steps, but they do not preclude the presence or addition of one or more other features, integers, components, steps, or groups thereof. The terms upper, upwardly, lower, bottom, top, down, downwardly, vertical, horizontal, and other directional terms in this description are in reference to the diagrammatic orientations depicted in the drawings and are only used for convenience and clarity in this description unless otherwise indicated.

What is claimed is:

1. NMR sample apparatus for positioning a sample fluid at a geometric center between juxtaposed pole faces of a NMR magnet assembly for NMR analysis, comprising:
   a capillary cartridge assembly comprising a capillary captured in a channel in an elongated board assembly that is sized to fit between the pole faces and an RF coil surrounding a portion of the capillary that is captured in the channel;
   wherein the capillary cartridge assembly is configured to be installed into and removed from a position between the two juxtaposed pole faces where the portion of the capillary that is surrounded by the RF coil is located at the geometric center of the NMR magnet assembly.

2. The NMR sample apparatus of claim 1, wherein the board assembly comprises two board pieces, each of which has a groove that is a mirror image of the groove in the other board piece, said two board pieces being fastened together with the groove in alignment to form the channel.

3. The NMR sample apparatus of claim 2, wherein the board pieces include magnet shim coils and electrically conductive traces for conducting electric current from outside the capillary cartridge assembly to the shim coils.

4. The NMR sample apparatus of claim 2, wherein each of the board pieces comprises electrically conductive means connected to the RF coil to provide a current path from outside the capillary cartridge assembly to the RF coil.

5. The NMR sample apparatus of claim 4, wherein the board pieces comprise printed circuit boards and the electrically conductive means includes conductive traces on the printed circuit boards.

6. The NMR sample apparatus of claim 5, wherein the printed circuit boards include magnet shim coils and electrically conductive traces for conducting electric current from outside the capillary cartridge assembly to the shim coils.

7. The NMR sample apparatus of claim 6, wherein each of the board pieces comprises multi-layer printed circuit boards with different shim coils on each layer.

8. The NMR sample apparatus of claim 7, wherein the elongated board assembly includes electric contacts exposed on one end adapted for making electric contact with electronic circuit means outside of the capillary cartridge assembly when the capillary cartridge assembly is positioned with the sample and the RF coil at the geometric center of the magnet assembly.

9. The NMR sample apparatus of claim 1, wherein the board assembly comprises two board pieces, one of which has a groove that forms the channel.

10. The NMR sample apparatus of claim 1, wherein the board assembly comprises two board pieces, one of which has a groove that forms a portion of the channel, another portion of the channel be formed at least partially by grooves or recesses in both of the boards.

11. The NMR sample apparatus of claim 1, wherein the board assembly comprises at least one board piece sandwiched between two outer board pieces, and wherein at least one board piece forms at least part of the channel.

12. The NMR sample apparatus of claim 11, wherein the two outer board pieces include magnet shim coils and electrically conductive traces for conducting electric current from outside the capillary cartridge assembly to the shim coils.

13. The NMR sample apparatus of claim 11, including an aperture in which a portion of the capillary is positioned.

14. The NMR sample apparatus of claim 13, in which said aperture is circular and said portion of the capillary extends diametrically through the center of the circular aperture.

15. The NMR sample apparatus of claim 1, wherein the channel provides a cavity and the RF coil is disposed within the cavity.

16. A method providing a sample in a NMR magnet assembly that has a magnet center, comprising:
  inserting a cartridge comprising a capillary captured in a channel in an elongated board assembly and an RF coil surrounding a portion of the capillary in a removable manner the NMR magnet assembly that includes guides, a limit stop, and electrical connections to position a portion of the capillary and the RF coil at the magnet center when the limit stop prohibits further insertion.

17. The method of claim 16, including flowing a sample through the capillary.

* * * * *